United States Patent [19]

Ueno et al.

[11] Patent Number: 4,758,781
[45] Date of Patent: Jul. 19, 1988

[54] DA CONVERTER TESTING SYSTEM

[75] Inventors: Toshiaki Ueno; Fumio Ikeuchi, both of Yokohama, Japan

[73] Assignee: Hitachi, Ltd., Tokyo, Japan

[21] Appl. No.: 938,966

[22] Filed: Dec. 8, 1986

[30] Foreign Application Priority Data

Dec. 6, 1985 [JP] Japan ................................ 60-273304
Dec. 20, 1985 [JP] Japan ................................ 60-285520

[51] Int. Cl.$^4$ ...................... G01R 31/28; H03K 13/00
[52] U.S. Cl. .............................. 324/73 R; 324/158 R; 371/15; 371/25
[58] Field of Search ................. 324/73 R; 371/15, 25; 340/347 DA, 347 CC, 347 M

[56] References Cited

U.S. PATENT DOCUMENTS

| | | | |
|---|---|---|---|
| 4,335,373 | 6/1982 | Sloane | 340/347 DA X |
| 4,419,656 | 12/1983 | Sloane | 340/347 DA X |
| 4,465,995 | 8/1984 | Sloane | 324/73 R X |
| 4,539,683 | 9/1985 | Hahn et al. | 324/25 X |
| 4,673,917 | 6/1987 | Urschel et al. | 340/347 CC X |

Primary Examiner—Ernest F. Karlsen
Assistant Examiner—Vinh P. Nguyen
Attorney, Agent, or Firm—Antonelli, Terry & Wands

[57] ABSTRACT

A DA converter testing system for testing DA converters which convert digital information into analog information, particularly suitable for testing the dynamic characteristics of such DA converters. The DA converter testing system has an AD conversion means which receives the analog output signal of a test DA converter, operating at a conversion period greater than the waveform repetition period of the repetitive output waveform of the test DA converter. Accordingly, the fast repetitive output waveform of the test DA converter can be converted into corresponding digital codes at a high accuracy and hence the DA converter testing system is more suitable than the conventional DA converter testing system, for testing the dynamic characteristics of DA converters.

16 Claims, 13 Drawing Sheets

DA CONVERTER TESTING SYSTEM

BACKGROUND OF THE INVENTION

The present invention relates to a DA converter testing system for testing a DA converter for converting digital information into analog information and, more particularly, to a DA converter testing system suitable for testing the dynamic characteristics of a DA converter.

Recently, demand for the DA converter capable of rapid conversion of a digital signal into an analog signal has expanded sharply in the fields of high-resolution video graphic displays and OA equipments, and the importance of methods and apparatus for testing the dynamic characteristics, such as glitches and settling time, of the DA converter affecting the performance of the DA converter during the transition of input digital codes has increased accordingly. A measuring method of measuring the linearity of the DA converter is disclosed, for example, in Japanese Unexamined Patent Publication No. 58-172562.

FIG. 14 is a block diagram showing the constitution of the above-mentioned testing system, and FIG. 15 is a timing diagram of assistance in explaining the relation between the conversion clock signal and the converted output. A conversion clock generated by a clock generator 200 regulates the speed of conversion of digital data supplied to a test DA converter 3. The start and stop of the conversion clock generated by the clock generator 200 are controlled by control signals provided by a control unit 110. A counter 30 counts the conversion clocks and gives signals having a digital code for sequentially increasing the DA-converted outputs to the test DA converter 3. The converted output of the test DA converter 3 is converted according to a conversion command having a speed equal to the conversion clock speed into a digital signal by an AD converter 4. When the input digital code applied to the test DA converter 3 and the level of an expected DA-converted output are different from each other, the output digital code of the AD converter 4 and the input digital code for the test DA converter 3 are different from each other. Accordingly, the conversion characteristics of the test DA converter 3 can be known through the comparison of the input digital code and the output digital code.

However, the above-mentioned conventional system has the following problems. That is, the conventional system is unable to test significant test items, namely, fast phenomena such as spikes (so-called glitches) that appears in the output waveform during the transition of the input digital code, and settling time, among the dynamic characteristics of the DA converter. In the conventional system, glitches superposed on the outut waveform during the transition of the input digital code given to the test DA converter is applied just as they are to the test DA converter. When such fast spike waveforms are applied to the AD converter, the effective resolution of the AD converter is deteriorated, the conversion action is unable to follow the input, the accuracy of the test is deteriorated, and large errors are caused in the test results. Furthermore, even if the conversion action is able to follow the input, the accurate AD conversion of the fast phenomena which are far faster than that of ordinary glitches is impossible, because the test DA converter and the AD converter are operating at the same conversion speed.

SUMMARY OF THE INVENTION

Accordingly, it is an object of the present invention to provide a DA converter testing system capable of solving the above-mentioned problems of the prior art, and of testing fast phenomena such as glitches and settling time.

In order to achieve the object of the invention, the present invention provides a DA converter testing system comprising: a test DA converter; a pattern generator which generates input digital data to be applied to the test DA converter repeatedly; a first clock generating means which generates clocks for regulating the period of a pattern produced by the pattern generator; an AD converter which receives the output analog signal of the test DA converter; a second clock generating means which generates clocks for regulating the conversion period of the AD converter so that the conversion period of the AD converter is greater than the period of the repetitive waveform provided by the test DA converter; a memory means which stores the outputs of the AD converter; and a computing means which analyzes the data stored in the memory means.

According to the present invention, the fast repetitive waveform provided by the test DA converter is AD-converted at low-speed conversion clocks, a low-speed high-accuracy AD converter can be employed. Accordingly, the high-accuracy AD-conversion of fast signals without entailing increase in the test errors of the AD conversion means is possible.

DETAILED DESCRIPTION OF THE PREFERRED EMBODIMENTS

Figure 1:
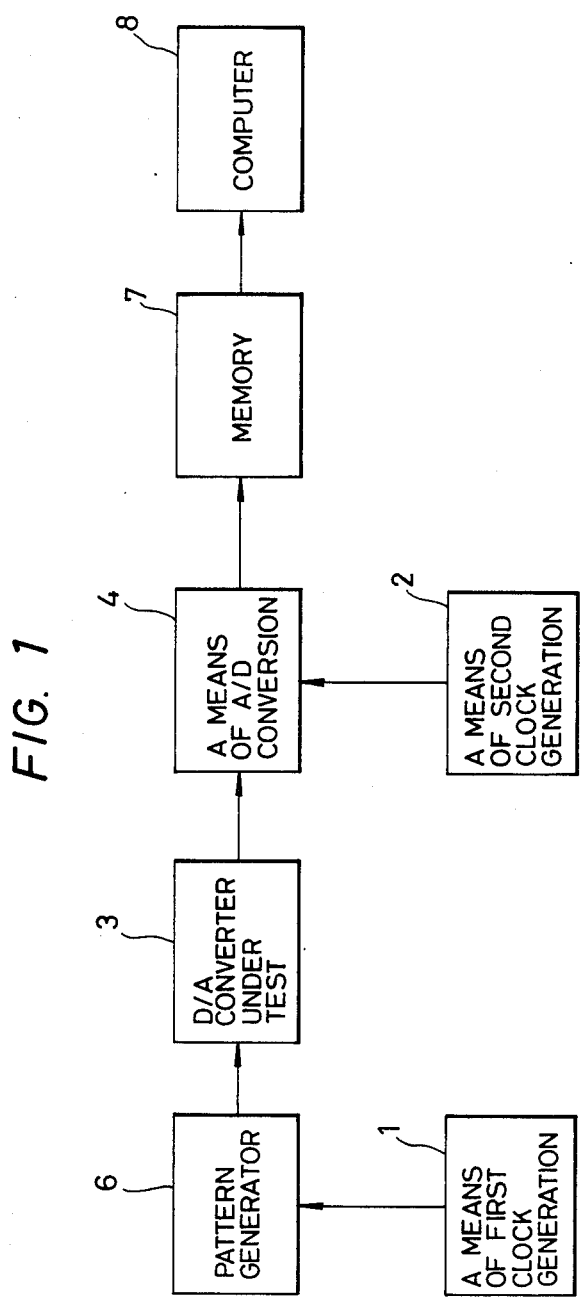
FIG. 1 is a block diagram showing the basic constitution of the present invention.

Referring to FIG. 1 showing the basic constitution of the present invention, a DA converter testing system according to the present invention comprises a pattern generator 6, a first clock generating means 1 which generates clocks for regulating the period of a pattern produced by the pattern generator 6, a test DA converter 3 which receives the pattern from the pattern generator 6, and AD conversion means 4 which receives the output analog signal of the test DA converter 3, a second clock generating means 2 which generates clocks for regulating the conversion period of the AD conversion means 4 so that the conversion period of the AD conversion means 4 is greater than the waveform repetition period of the repetitive waveform produced by the DA converter 3, a memory 7 for storing the output of the AD conversion means 2, and a computer 8 for analyzing the data stored in the memory 7.

Preferred embodiments of the present invention will be described hereinafter with reference to the accompanying drawings.

First, first and second embodiments will be described.

Figure 2:
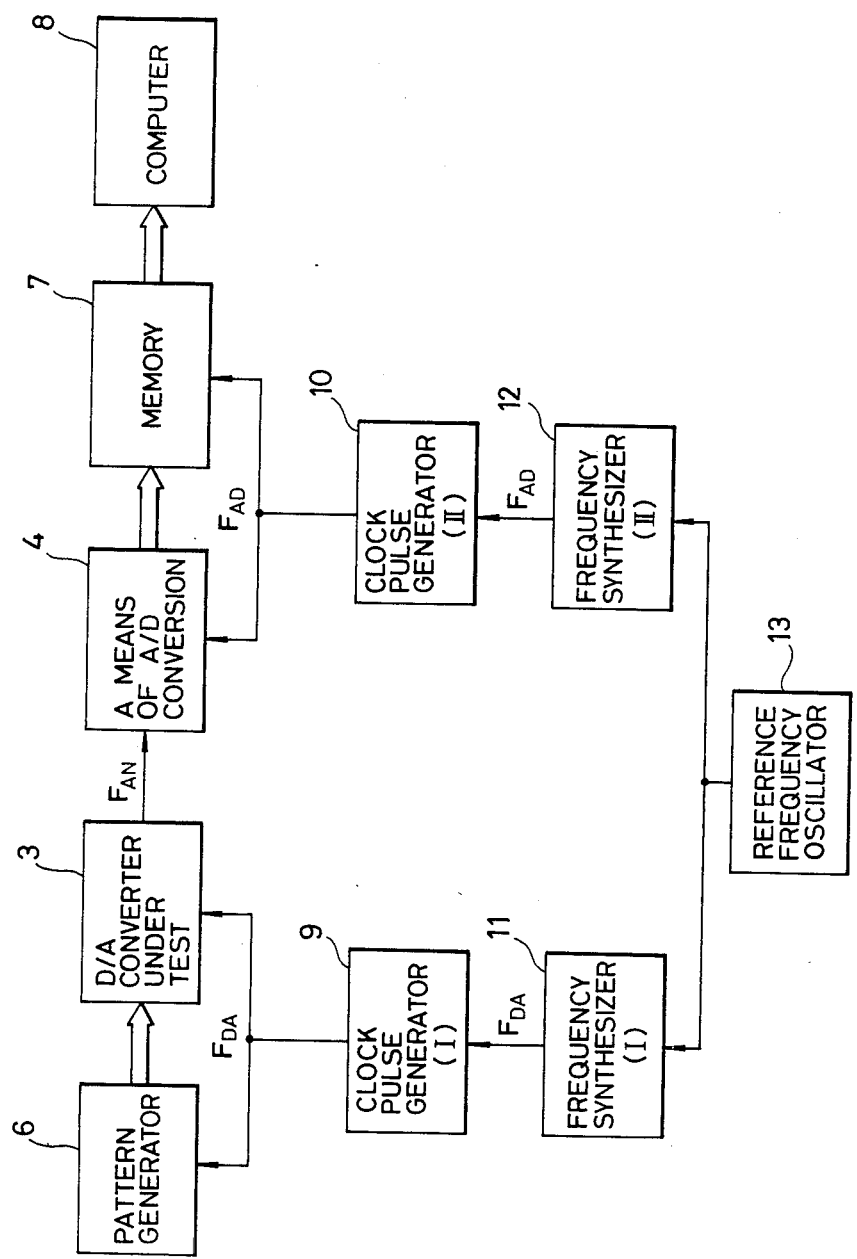
FIG. 2 is a block diagram showing the constitution of a first embodiment of the present invention.

Referring to FIG. 2 showing the constitution of a first embodiment of the present invention, there are shown a pattern generator 6, a test DA converter 3, an AD converter 4, a memory 7, a computer 8, a first clock pulse generator 9, a second clock pulse generator 10, frequency synthesizers 11 and 12, and a reference frequency oscillator 13.

The waveform of an output signal of a frequency $F_{DA}$ of the first frequency synthesizer 11 is shaped by the first clock pulse generator 9 to provide a clock pulse signal of a frequency $F_{DA}$. The clock pulse signal of a frequency $F_{DA}$ is applied to the pattern generator 6 and the test DA converter 3. Then, the pattern generator 6 gives a digital pattern repeatedly at the frequency $F_{DA}$ to the test DA converter 3. The test DA converter 3 provides an analog signal of a frequency $F_{AN}$ corresponding to the input digital pattern. When n kinds of data are provided repeatedly at digital pattern data generating cycles, $F_{AN}=F_{DA}/n$. On the other hand, the waveform of an output signal of a frequency $F_{AD}$ of the second frequency synthesizer 12 is shaped by the second clock pulse generator 10 to provide a clock pulse signal of a frequency $F_{AD}$. The clock pulse signal of a frequency $F_{AD}$ is applied as a clock signal to the AD converter 4 and the memory 7 to convert an analog waveform of a frequency $F_{AN}$ provided by the test DA converter 3 into digital data by the AD converter 4 and to store the digital data in the memory 7. The data thus stored is analyzed and evaluated by the computer 8 to test the characteristics of the test DA converter 3.

The stability of the first and second frequency synthesizers 11 and 12 is enhanced by giving signals from a common high stability signal source, namely, the reference frequency oscillator 13. When the first and second frequency synthesizers are operated individually and are set differently, the respective frequencies of the respective output signals of the first and second frequency synthesizers 11 and 12 are different from each other, and thereby the measuring accuracy is deteriorated, whereas, when the first and second frequency synthesizers 11 and 12 are connected to a common signal source, namely, the reference frequency oscillator 13, the relative variation of the respective output signals of the first and second frequency synthesizers 11 and 12 will not occur even if the output frequency of the common signal source varies, and hence the measuring accuracy is not deteriorated.

In order to simultaneously realize testing the test DA converter 3 at the highest rate and operating the AD converter 4 within a high accuracy range, the following expressions (1) and (2) must be satisfied.

$$F_{AD}=F_{AN}\times N/M \tag{1}$$

$$F_{AN}=F_{DA}/n \tag{2}$$

where:
$F_{AD}$: conversion frequency of the AD converter,
$F_{DA}$: conversion frequency of the test DA converter,
$F_{AN}$: frequency of the analog waveform signal,
n: the number of steps of $F_{DA}$ in one cycle for producing $F_{AN}$,
N: the number of data given to the AD converter, and
M: the number of cycles of $F_{AN}$ necessary for receiving N pieces of data.

In Exp. (1) and (2), M and N are mutually prime.

The relation represented by Exp. (1) and (2) will be explained with reference to FIG. (3). Patterns shown in FIG. 3 will be designated, from the top down, as patterns (a), (b), (c) and (d). The pattern (a) is an exemplary output pattern of the test DA converter. In this example, the test DA converter is a DA converter of 3-bit (8-level) resolution. The input is increased in eight steps by an increment of one from "000" to "111". The conversion rate is $F_{DA}$ and the frequency $F_{AN}$ of the repetitive pattern is $F_{DA}/8$ (n=8 in Exp. (2)).

The pattern (b) represents the conversion clock pulse of a frequency $F_{DA}$ of the AD converter for converting the output signal of the test DA converter. The pattern (c) represents the AD conversion data. The resolution of the AD converter is four bits, which is greater than that of the test DA converter.

Figure 3:
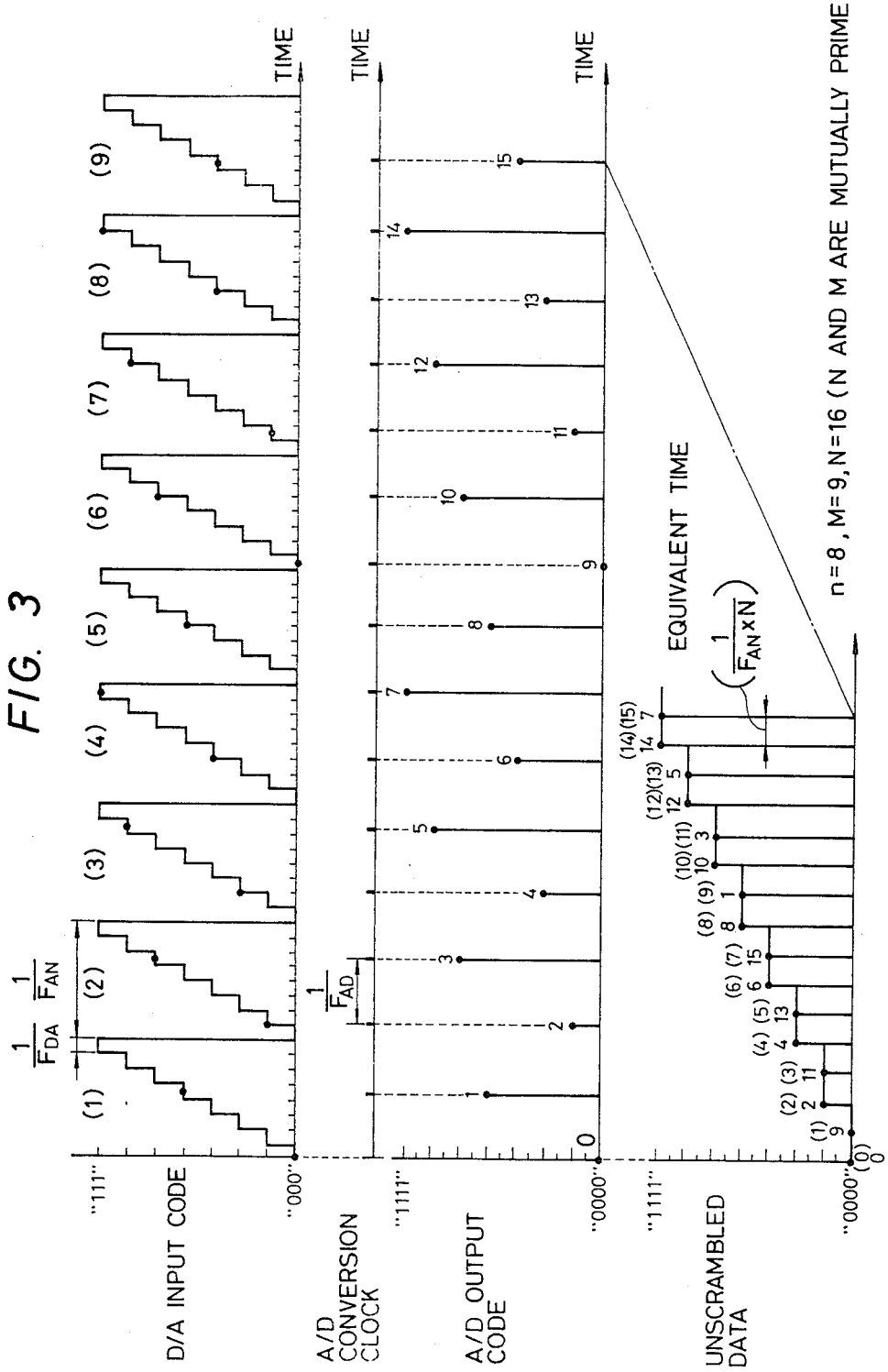
FIG. 3 is a signal timing diagram of assistance in explaining the operation of the first embodiment.

When the frequencies $F_{AD}$, $F_{DA}$ and $F_{AN}$ are set in conformity with Exps. (1) and (2) as shown in FIG. 3, the AD converter samples at sixteen different points (N=16) on the repetitive pattern. Howver, as represented by the pattern (c), the sampled data are arranged random and it is difficult to estimate the original pattern from the pattern (c). However, the original pattern can be restored as represented by the pattern (d) by unscrambling the sampled data. The algorithm for unscrambling is expressed by:

$$(x\times M)\ Mod\ N=W \tag{3}$$

$$Ad=(i\times J)\ Mod\ N \tag{4}$$

where J=x for W=1.

In Exp. (3), x is increased from zero by an increment of one at a time, and then a value J of x for W=1 is substituted into Exp. (4). In Exp. (4), i corresponds to the parenthesized value of the sampled data on the pattern (d) in FIG. 3, while Ad indicates the value below the parenthesized value, namely, the address of the memory before the unscrambling of the data corresponding to the value of i. In Exp. (4), 0, 1, 2, . . . are substituted sequentially for i to obtain the values of Ad to unscramble the data corresponding to the values of i to obtain the pattern (d) shown in FIG. 3. In FIG. 3, substituting 16 (sixteen) for N and 9 (nine) for M into Exp. (3), J=9 is obtained. Therefore, i=0: Ad=0, and i=1: Ad=9. Substituting Exp. (2) into Exp. (1), we obtain $$F_{AD} = F_{DA} \times N/(M \times n) \quad (5)$$

Then, for the example shown in FIG. 3, $F_{AD} \approx 0.2 \times F_{DA}$. Thus, the conversion clock pulse of the AD converter is approximately 1/5 of that of the test DA converter. The frequency relation represented by Exps. (1) and (2) and the scrambling operation is equivalent to sampling at a clock faster than $F_{DA}$. In the case of FIG. 3, the conversion clock pulse of the AD converter is equivalent to twice the $F_{DA}$.

A second embodiment of the present invention will be described with reference to FIG. 4. The constitution of the second embodiment is the same as the first embodiment.

Figure 4:
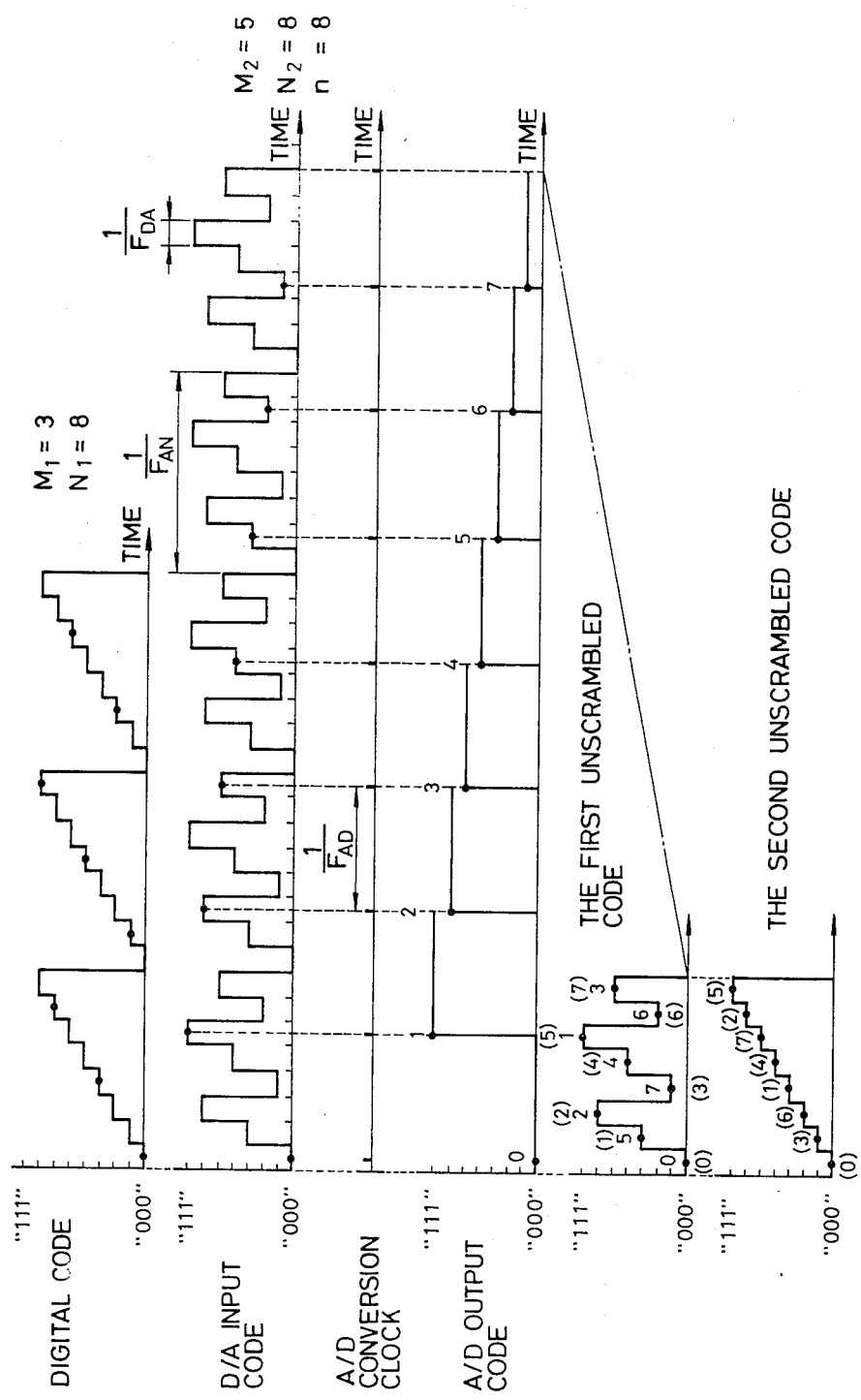
FIG. 4 is a signal timing diagram of assistance in explaining the operation of a second embodiment of the present invention.

Patterns shown in FIG. 4 will be designated, from the top down, as patterns (a), (b), (c), (d), (e) and (f), respectively. In the operation of the first embodiment in the mode as illustrated in FIG. 3, digital data which increases monotonously in regular steps having the pattern (a) (FIG. 3) is used for testing the test DA converter. However, in practical operation, digital data having such a pattern is unable to test the test DA converter sufficiently severely. The pattern (a) (FIG. 4) is unscrambled to provide a digital pattern (d) (FIG. 4) in order to subject the test DA converter to a severe test. In FIG. 4, the pattern (b) is obtained by sampling every three digital codes of the pattern (a) varying in eight steps ($N_1 = 8$) from "000" to "111" at an increment of one. That is, the pattern (b) is obtained by unscrambling the pattern (a) on the basis of the relation between $M_1$ and $N_1$. Digital codes having such a pattern is given to the test DA converter, and then the analog output of the test DA converter is conveted again into digital codes by the AD converter. The number and frequency of the codes show the sampling of eight data ($N_2 = 8$) from the output ($n = 8$, $M_2 = 5$) of the test DA converter by the AD converter. That is, $F_{AN} = F_{DA}/n = F_{DA}/8$, and $F_{AD} = F_{AN} \times N_2/M_2 = F_{DA}/5$. Thus, the AD converter is able to carry out sampling at a satisfactory low frequency as compared with the conversion rate of the test DA converter.

However, the digital codes sampled on the basis of the above-mentioned expression assume the pattern (d) of FIG. 4 and the pattern (d) is different from that of the original data. Therefore, similarly to the procedure taken by the first embodiment shown in FIG. 3, the sampled codes need to be unscrambled in the patterns (e) and (f) as shown in FIG. 4 to reproduce the data having the same pattern as that of the original data. In order to reproduce the data having the same pattern as that of the original data, first, the data of the pattern (d) is unscrambled in the pattern (e) (primary data unscrambling) to reproduce the same pattern of the data as the pattern (b). In unscrambling the data, $M_2$ and $N_2$ are substituted into Exp. (3) to obtain J, and then J is substituted into Exp. (4).

Then, the data of the pattern (e) is unscrambled in the pattern (f) (secondary data unscrambling), in which $M_1$ and $N_1$ are substituted into Exp. (3) to obtain J, and then J is substituted into Exp. (4).

Thus, the test DA converter is subjected to a severe test, while the sampling load on the AD converter is small.

The rest of the preferred embodiments of the present invention will be described hereinafter with reference to the accompanying drawings.

Figure 5:
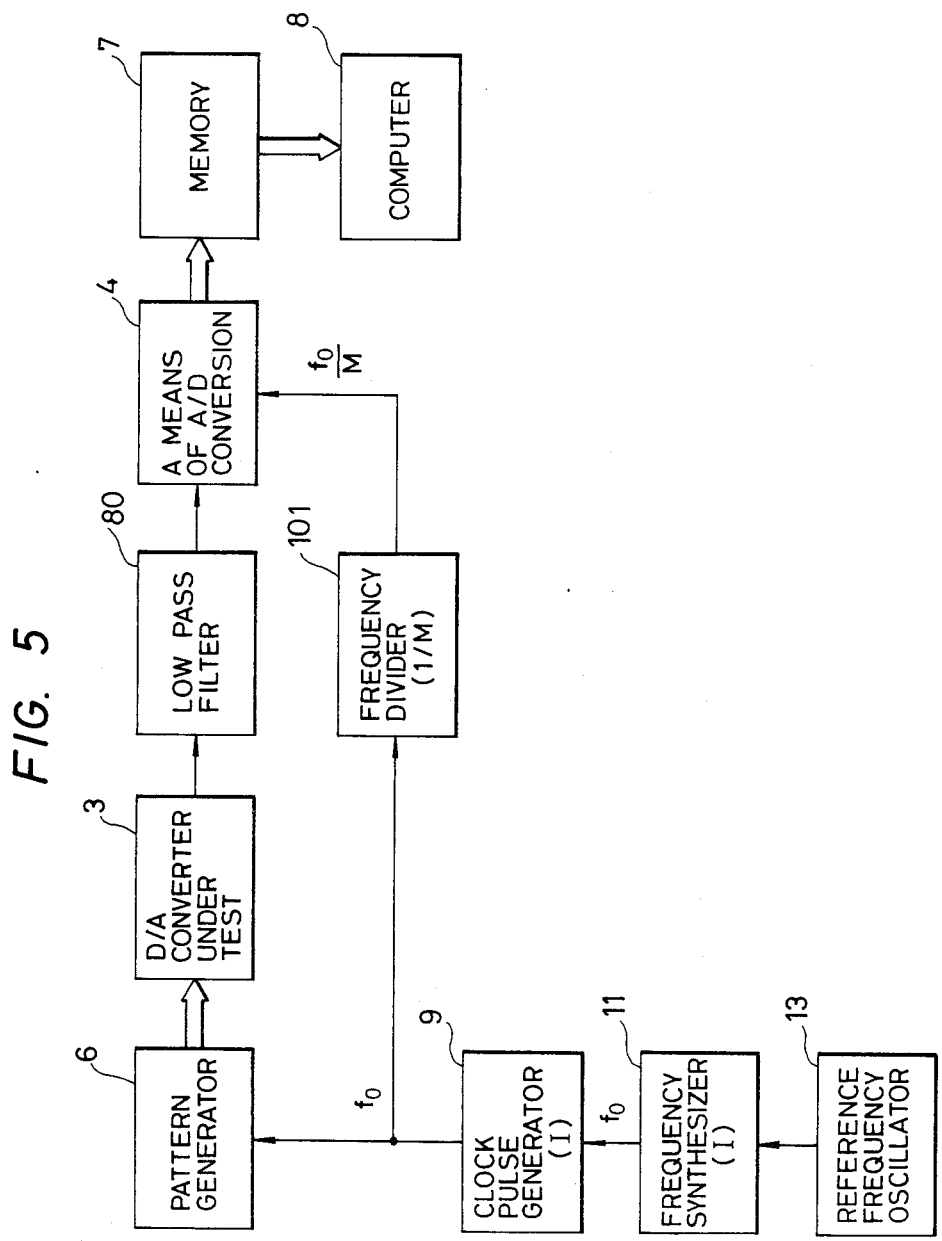
FIG. 5 is a block diagram showing the constitution of a third embodiment of the present invention.

Referring to FIG. 5, showing the constitution of a third embodiment of the present invention, there are shown a clock pulse generator 9, a test DA converter 3, an AD converter 4, a frequency synthesizer 11, a pattern generator 6, a low-pass filter 80, a memory 7, a divider 101, and a computer 8.

The frequency synthesizer 11 generates a reference frequency $f_0$ of low-phase noise for regulating the conversion speed of the test DA converter 3. The clock pulse generator 9 generates low-jitter conversion clock pulses synchronous with the reference frequency $f_0$. The pattern generator 6 generates digital test codes corresponding in number to the number of bits of the test DA converter 3. The digital test codes are parallel codes of a bit number sychronous with the conversion clock frequency $f_0$, and the repetitive generation of optional codes is possible. The output analog signal of the test DA converter 3 is converted into a digital signal by the AD converter 4 having a resolution higher that that of the test DA converter 3. The low-pass filter 80 is inserted between the test DA converter 3 and the AD converter 4 to eliminate folding errors attributable to the harmonic components of the outut signal of the test DA converter 3. The output frequency $f_0$ of the clock pulse generator 9 is divided by the divider 101 at a frequency dividing ratio M to apply conversion clock pulses of a frequency $f_0/M$ to the AD converter 4.

Thus, the AD converter 4 is able to convert the output signal of the DA converter 3 into a digital signal every M cycles of the reference frequency $f_0$. The output codes of the AD converter 4 are stored in the memory 7, and then the computer 8 analyzes the codes stored in the memory 7.

Figure 6:
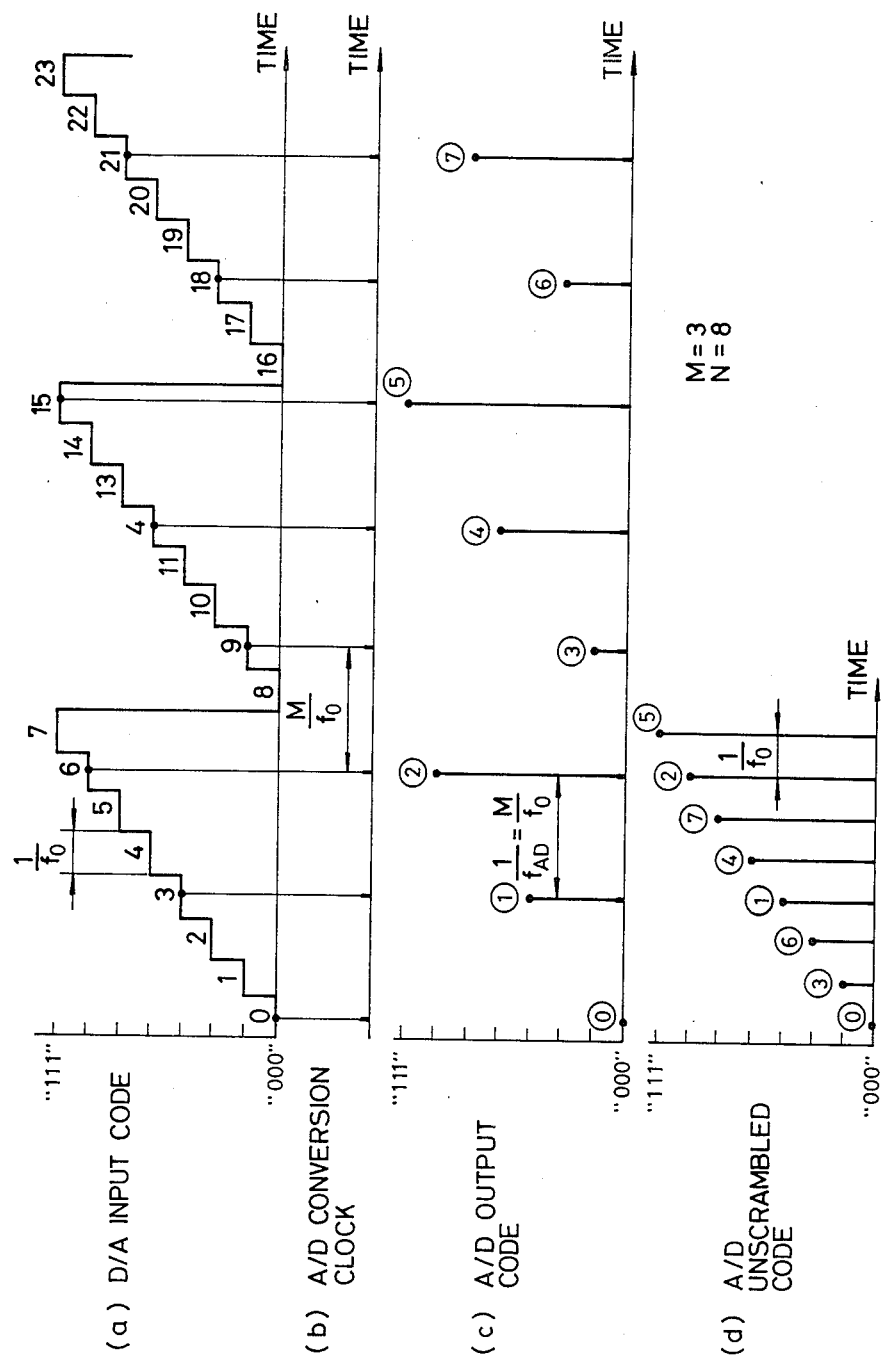
FIG. 6 is a signal timing diagram of assistance in explaining the operation of the third embodiment.

The third embodiment will be described more specifically with reference to FIG. 6 as applied to testing a 3-bit test DA converter 3. FIG. 6 (a) shows three cycles of input codes corresponding to eight levels of the 3-bit test DA converter 3, generated by the pattern generator 6.

FIG. 6 (b) shows timings for the conversion clock pulses applied to the AD converter 4. The AD converter 4 converts the output signal of the test DA converter 3 every $M/f_0$ (M = frequency dividing ratio = 3, $f_0$ = the frequency of the conversion clock pulses applied to the test DA converter 3). The AD conversion timings corresponds to the respective middle points of duration of the output levels of the test DA converter 3 (FIG. 6 (a)).

Thus, 8-level output codes ⓪ to ⑦ of the AD converter 4 corresponding to the 3-bit resolution of the test DA converter 3 as shown in FIG. 6 (c) are obtained by making the frequency dividing ratio M with the number of repetition of the 8-level input codes corresponding to the resolution of the test DA converter 3.

Results equivalent to the AD conversion of the input codes of the test DA converter 3 every frequency $f_0$ is obtained by unscrambling the output codes as shown in FIG. 6 (d).

The foregoing relation is maintained when the conversion clock frequency $f_0$ of the test DA converter 3, the resolution n bits of the test DA converter 3, the conversion clock frequency $f_{AD}$ of the AD converter 4, and the frequency dividing ratio M meet the following equation:

$$f_{AD} = f_0/M \text{ (M and the number of codes } N = 2^n \text{ are mutually prime)} \quad (6)$$

Procedure for rearranging the outut codes shown in FIG. 6 (c) in an arrangement shown in FIG. 6 (d) will be described hereinafter.

Reproducing sequence for arranging the output codes of the AD converter 4 in the order of the output codes as shown in FIG. 6 (d) is determined by obtaining the respective surplus numbers of Nos. 0 to 23 attached to the input codes of the test DA converter 3 as shown in FIG. 6 (a) to $N=2^n$. When a surplus number to $N=2^n$ is represented by mod(N), in the case of FIG. 6, $2^3 = 8$, and hence the output codes shown in FIG. 6 (c) may be rearranged in the order of mod(8). That is, the mod(8) of the input code No. 6 shown in FIG. 6 (a) is six and the corresponding output code ② of the AD converter shown in FIG. 6 (c) is positioned at the fifth input position in FIG. 6 (d). Similarly, the mod(8) of the input code No. 15 shown in FIG. 6 (a) is seven and the corresponding output code 5 is positioned at the seventh position in FIG. 6 (d). This operation for rearranging the ouput codes is carried out by the computer 8.

Thus, in the third embodiment, the conversion clock speed of the AD converter 4 can be reduced when the divider 101 has a large frequency dividing ratio. That is, when the frequency dividing ratio is M, the conversion clock speed of the AD converter 4 is 1/M of that of the test DA converter 3. Accordingly, the AD converter may be operated at a low conversion clock speed, which does not deteriorate the dynamic characteristics of the AD converter 4 even if the test DA converter 3 is operated at the maximum conversion speed. Thus, the DA converter testing system of the present invention is capable of operating at a higher accuracy than the conventional DA converter testing system for testing the dynamic characteristics of the DA converter.

Figure 7:
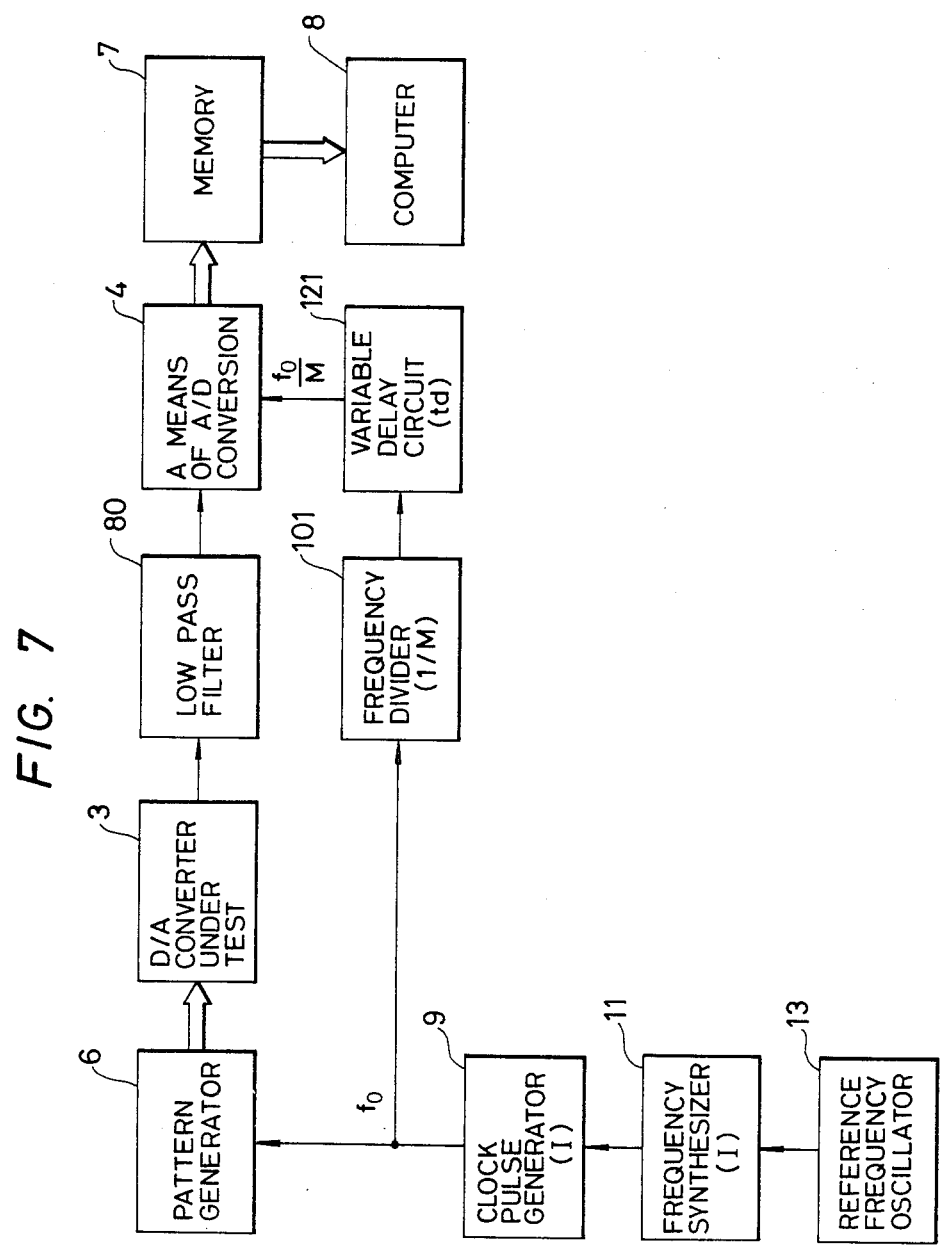
FIG. 7 is a block diagram showing the constitution of a fourth embodiment of the present invention.

A fourth embodiment of the present invention will be described with reference to FIG. 7.

Basically, the fourth embodiment is the same as the third embodiment in constitution except that the fourth embodiment is provided additionally with a variable delay circuit 121. The basic mode of operation of the fourth embodiment is the same as that of the first embodiment. The variable delay circuit 121 delays the output time of the divider 101. Accordingly, the timing of operation of the AD converter 4 for converting the output codes of the test DA converter is variable.

Figure 8:
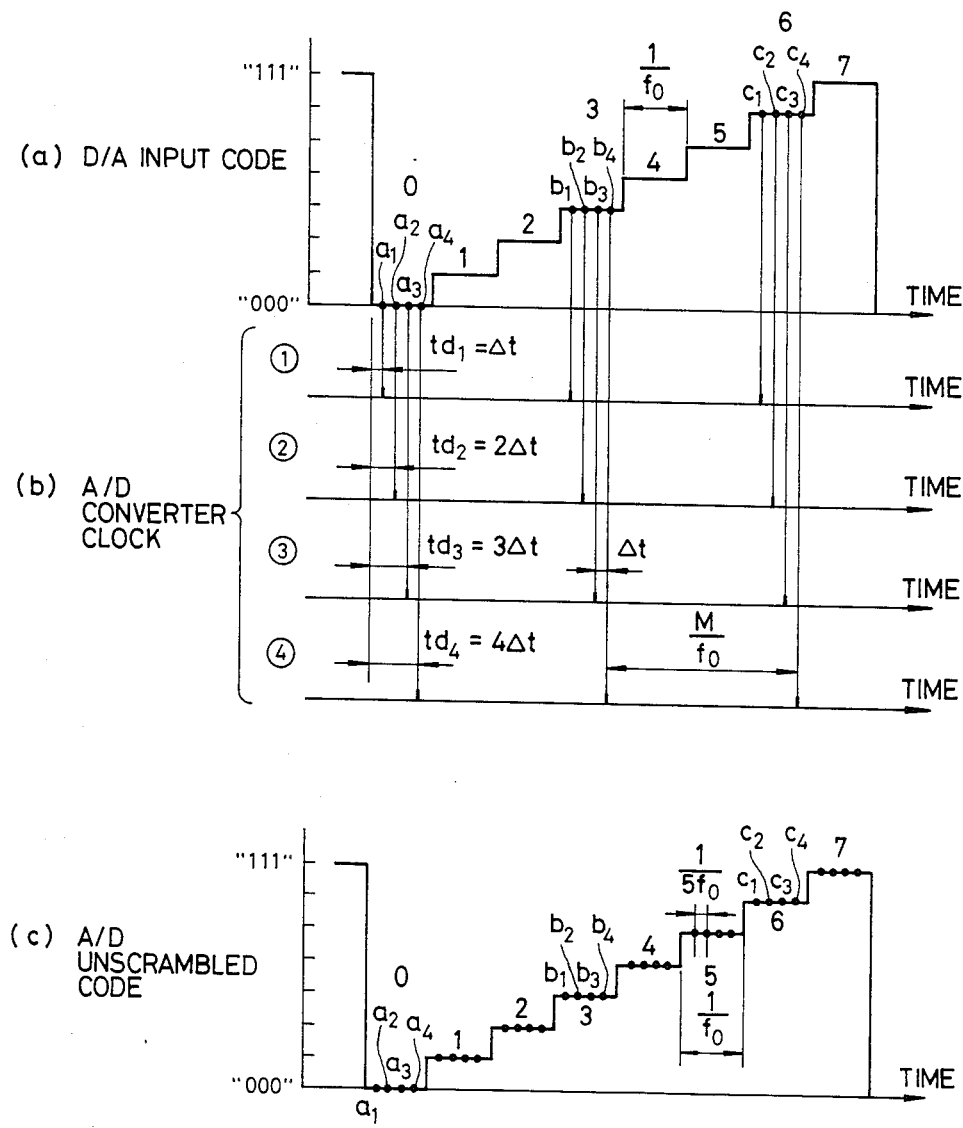
FIG. 8 is a signal timing diagram of assistance in explaining the operation of the fourth embodiment.

FIG. 8 shows, similarly to FIG. 6, a mode of testing the output codes of $2^3 = 8$ levels of the 3-bit test DA converter 3. In FIG. 8 (a), input codes Nos. 0 to 7 among the input codes Nos. 0 to 23 shown in FIG. 6 (a) are shown and the input codes Nos. 8 to 23 (second cycle) are omitted. In FIG. 8 (b)-1, the delay time td of the variable delaying circuit 121 is $td_1 = \Delta t$. Suppose that AD converted codes sampled at thus delayed timing are a1, b1 and c1. Then, the AD converted codes are unscrambled according to the above-mentioned mod(N) as shown in FIG. 8 (c). Similarly, when the delay time td of the variable delaying circuit 121 is $td_2 = 2\Delta t$, the AD converted codes are sampled at thus delayed timing a2, b2 and c2. Similarly, the AD converted codes can be sampled at minute intervals by increasing the delay time at an increment of $\Delta t$. In spite of AD conversion at a frequency interval of $f_0/M$, the reproduced output codes equivalent to those sampled at minute frequency intervals as shown in FIG. 8 (c) are obtained by sequentially synthesizing the reproduced codes obtained by increasing the delay time td by an increment of $\Delta t$ at a time by the computer 8.

Reproduced output codes analyzing procedure of the computer 8 will be described hereinafter.

Figure 9:
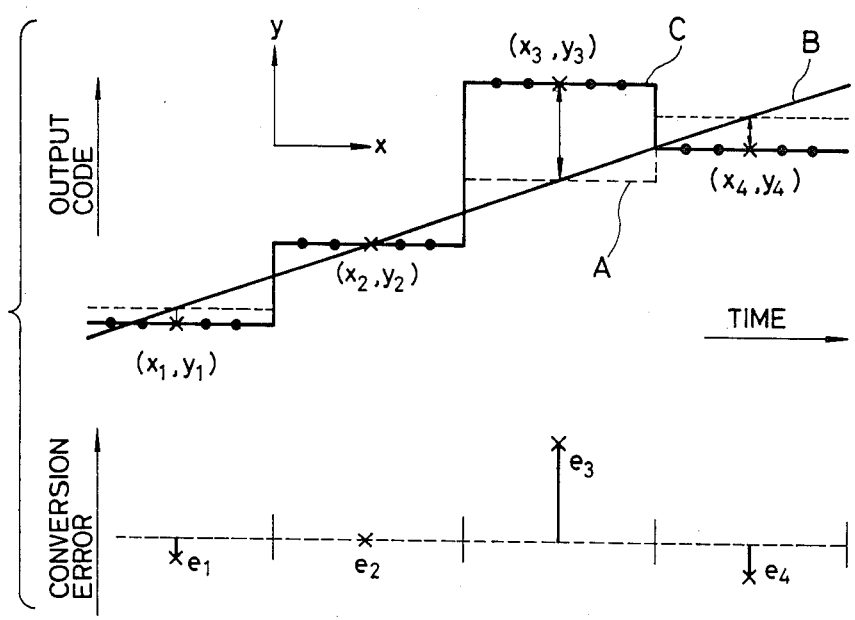
FIG. 9 is a diagrammatic illustration of assistance in explaining the algorithm for calculating a conversion error.

FIG. 9 shows, by way of example, a mode of AD conversion of four output codes of four levels, respectively, of the test DA converter 3. Broken lines A indicate the levels of expected analog signals corresponding to digital codes given to the test DA converter 3, respectively. Continous line B passes the respective middle points of the intervals of duration of the expected analog signals indicated by broken lines A. Lines C pass the levels of the output codes indicated by dots of the AD converter 4. The respective differences between the broken lines A and the corresponding lines C are conversion errors of the test DA converter 3. The conversion errors are determined through the following procedure. The line B representing ideal DA conversion characteristics of the test DA converter 3 can readily be obtained through calculation. Then, the respective coordinates (x1, y1) to (x4, y4) of the respective centers of the lines C are calculated. The difference between the y-coordinate of the line C and the y-coordinate of the line B at the corresponding x-coordinate is the conversion error. In FIG. 9, e1 to e4 are the respective conversion errors of the levels indicated by the coordinates (x1, y1) to (x4, y4). This procedure is applied to all the digital codes obtained through the AD conversion of the output analog signals of the test DA converter 3 to determine the conversion error in each digital code at a high accuracy.

Fifth and sixth embodiment of the present invention will be described hereinafter.

Figure 10:
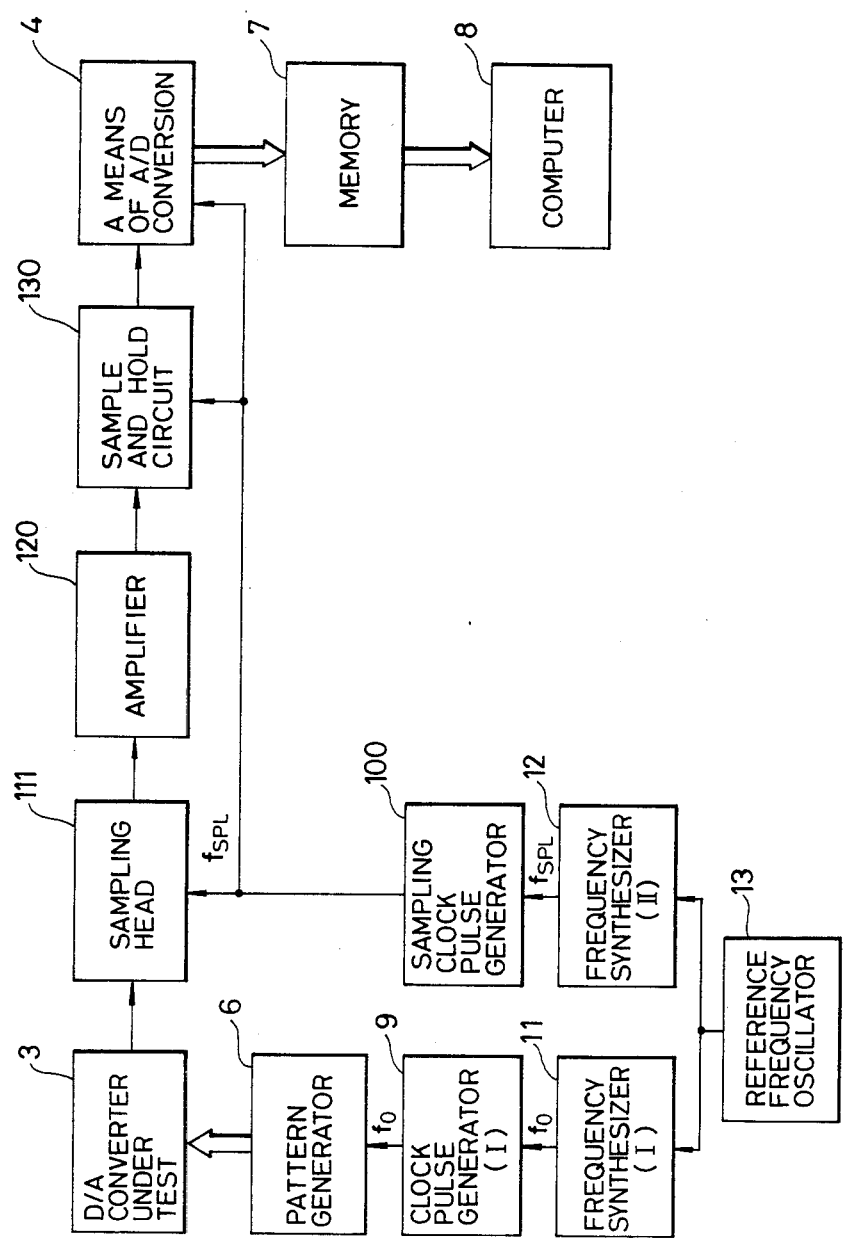
FIG. 10 is a block diagram showing the constitution of a fifth embodiment of the present invention.

Referring to FIG. 10, the fifth embodiment of the present invention comprises a test DA converter 3, a reference frequency oscillator 13, a first frequency synthesizer 11, a second frequency synthesizer 12, a pattern generator 6, a sampling clock generator 100, a sampling head 111, an amplifier 120, a sample-hold circuit 130, an AD converter 4, a memory 7, and a computer 8.

The first frequency synthesizer 11 generates a low-phase noise conversion frequency $f_0$ for regulating the conversion speed of the test DA converter 3. The second frequency synthesizer 12 generates a low-phase noise sampling frequency $f_{SPL}$ for regulating the conversion speed of the AD converter 4 and sampling speed. The sampling frequency $f_{SPL}$ is supplied to the sampling system. The frequencies $f_0$ and $f_{SPL}$ are synchronized by a reference signal provided by the reference frequency oscillator 13. The pattern generator 6 generates digital codes of a number corresponding to the number of bits of the test DA converter 3. The digital codes generated by the pattern generator 6 are parallel codes synchronous with the reference frequency $f_0$. Optional test codes can repeatedly be produced according to a program. The output analog signals of the test DA converter 3 are sampled by the wide-band sampling head 111. A sampling waveform of a low speed is amplified by the amplifier 120 to correct amplitude reduction due to the sampling efficiency of the sampling head 111. The high-speed sampling head 111, in general, has a low droop rate, namely, an attenuation factor of the hold waveform voltage, and hence the sampling head 111 is incapable of satisfactorily accurate voltage holding within a sampling cycle. Accordingly, the sample-hold circuit 130 having a satisfactory droop rate is provided after the amplifier 120 to prevent the reduction of the hold waveform voltage so that the voltage holding accuracy is improved. That is, since the speed of the samplign waveform is low as compared with the output analong signal of the test DA converter 3, the sample-hold circuit 130 may be a sample-hold circuit having a good droop rate, and thereby the testing accuracy can be improved. Furthermore, the waveform after sample hold is subjected to AD conversion by the AD converter 4 having a resolution higher than that of the DA converter 3. The outputs of the AD converter 4 are stored in the memory 7, and then the data stored in the memory 7 are analyzed by the computer 8 to examine the dynamic characteristics of the test DA converter 3.

Figure 11:
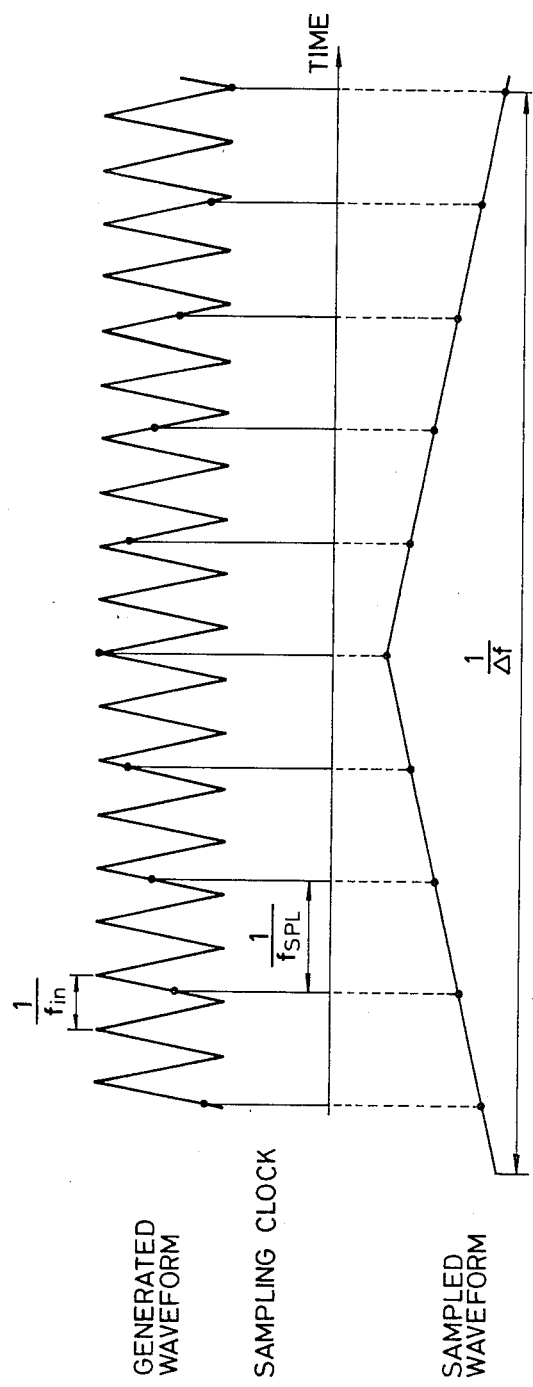
FIG. 11 is a signal timing diagram of assistance in explaining the operation of the fifth embodiment.

The mode of operation of the fifth embodiment shown in FIG. 10 will be described more specifically with reference to FIG. 11, in which positive values for the amplitude of signals are measured upward on the vertical axis, while positive values for time are measured to the right on the horizontal axis. Waveforms illustrated in FIG. 11 are designated, from the top down, as waveforms (a), (b) and (c), respectively. The waveform (a) is an analog output waveform of the test DA converter 3 when the pattern generator 6 generates repetitive triangular waveform codes of a freqeuency $f_{in}$. The frequency $f_{in}$ and the conversion frequency $f_0$ are defined by $$N = f_0/f_{in} \quad (7)$$

where N is the number of patterns in one cycle of the repetitive triangular wave. The N pieces of test patterns are converted sequentially into digital codes corresponding to the resolution of the test DA converter 3.

The mode of sampling the continuously generated patterns at a sampling frequency $f_{SPL}$ will be explained with reference to the waveform (b) shown in FIG. 11. The relation between the frequency $f_{in}$ of repetition of the generated pattern and the sampling frequency $f_{SPL}$ is defined by $$f_{in} = n \cdot f_{SPL} + \Delta f \quad (8)$$

where n is a natural number and $\Delta f$ is the frequency of a sampling waveform after sampling. In the waveform (b), n=2. When $\Delta f \leq f_{SPL}$, a low speed sampling waveform can be reproduced from generated patterns of a plurality of frequencies. Accordingly, when the band width of the sampling head 111 is sufficiently large as compared with the frequency $f_{in}$ of repetition of the generated pattern, accurate sampling of the highspeed test waveform is possible. Since the frequency $\Delta f$ of the sampling waveform given to the AD converter is small, the reduction of the effective resolution of the AD converter 4 is avoided, and hence the high resolution of the AD converter 4, as compared with that of the test DA converter 3, is maintained. Accordingly, the conversion characteristics of the test DA converter 3 can readily be tested through comparing the genrrated pattern generated by the pattern generator 6, and the sampling data after conversion by the AD converter 4 by means of the computer 8.

The waveform of the generated pattern is not limited to the triangular waveform, but may be any optional repetitive waveform. For example, it is possible to apply a pattern of sinusoidal waveform to the test DA converter 3 and to evaluate the nonlinearity of the test DA converter 3 from a harmonic spectrum by processing the sampled codes of the AD converted waveform through fast Fourier transform by the computer 8.

Figure 12:
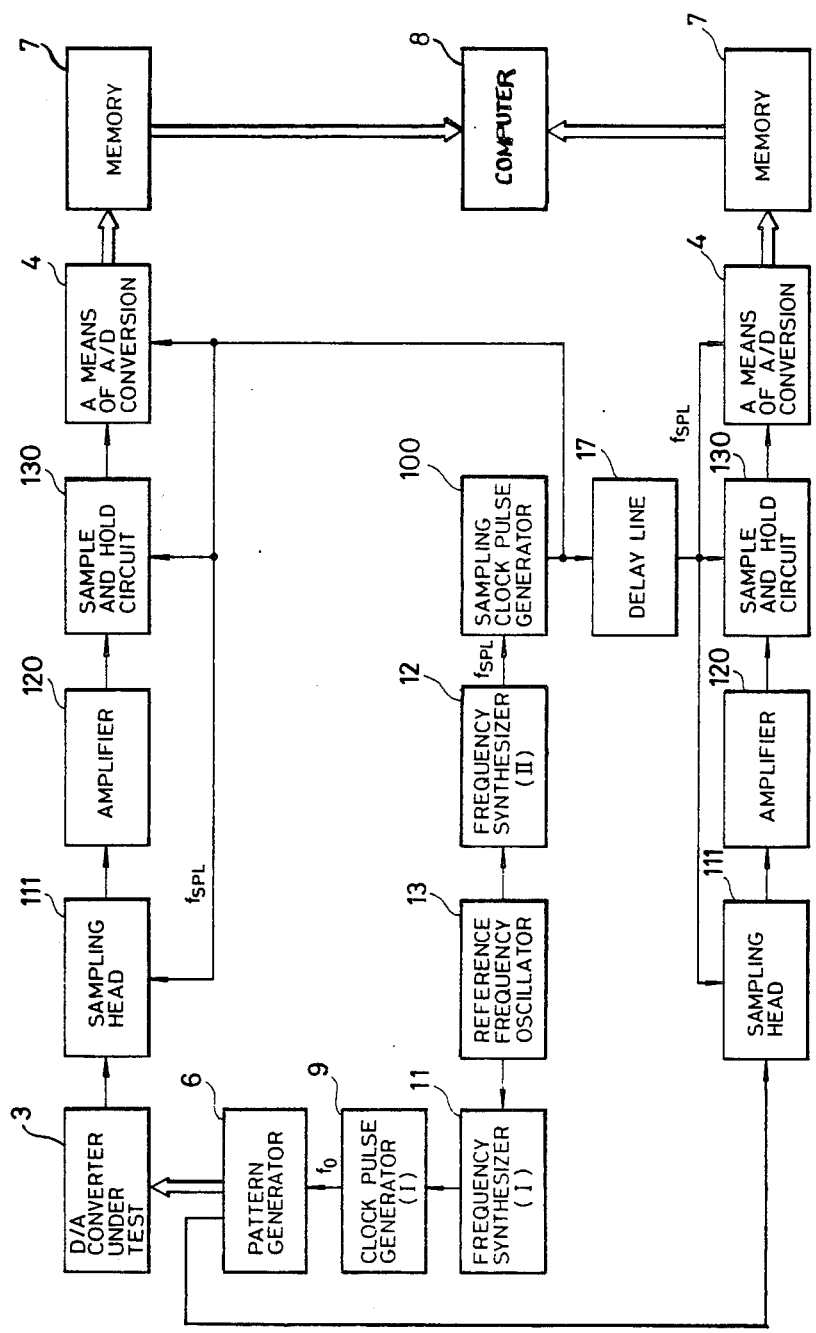
FIG. 12 is a block diagram showing the constitution of a sixth embodiment of the present invention.

The sixth embodiment of the present invention will be described hereinafter with reference to FIG. 12.

The sixth embodiment comprises two sets of waveform sampling systems in addition to elements the same as those of the fifth embodiment shown in FIG. 10. The constitution of the sixth embodiment is suitable for testing the settling time of a test DA converter 3, and is provided with a delay line 17.

One of the waveform sampling systems receives the analog output signal of the test DA converter 3, while the other waveform sampling system receives the code of a particular bit of a digital pattern to be applied to the test DA converter 3. The pattern generator 6 generates a pattern the same as that generated by the pattern generator of the fifth embodiment. In order to facilitate the observation of the settling time, the code of the particular bit is changed every repetition frequency $f_{in}$. The delay line 17 regulates the respective sampling signals of the two sets of the sampling systems to correct the time difference between the two sampling systems attributable to a signal propagation delay time.

Figure 13:
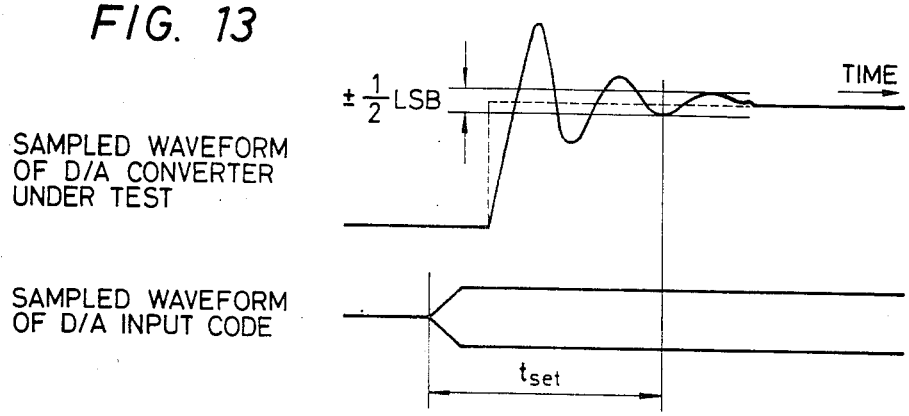
FIG. 13 is a diagrammatic illustration of assistance in explaining the mode of testing settling time by the sixth embodiment.
Figure 14:
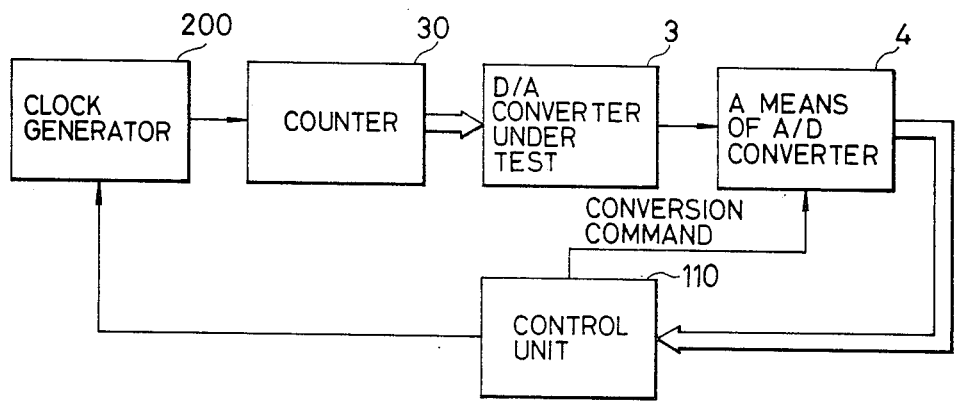
FIG. 14 is a block diagram showing the constitution of a conventional DA converter testing system.
Figure 15:
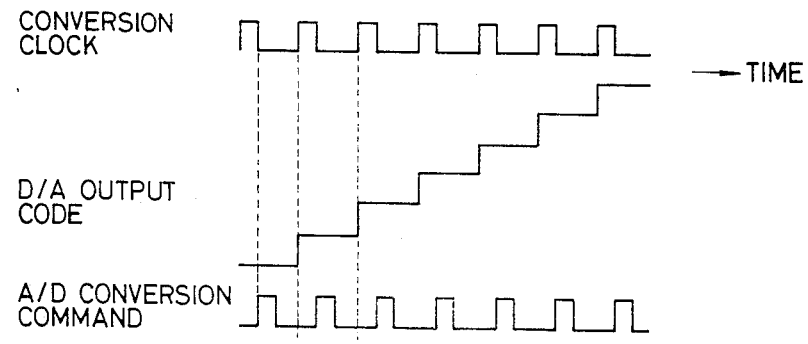
FIG. 15 is a signal timing diagram of assistance in explaining the operation of the conventional DA converter testing system.

A method of testing the settling time will be explained hereinafter with reference to FIG. 13. In FIG. 13, waveforms are designated, from the top down, a waveform (a) and a waveform (b). The waveform (a) is the leading edge of an output sampling waveform of the test DA converter 3 during the transition of the input codes. The output waveform of an ideal DA converter is the waveform of step response mode as indicated by broken lines. However, the output of a practical DA converter takes a certain period of time until the same settles at an expected value. Generally, a time interval from a moment ixmediately after the transition of the digital code to a moment when the output reaches within a range of ±LSB/2 (LSB=the least significant bit) is designated as a settling time. In FIG. 13, the settling time is indicated by $t_{set}$. The settling time can easily be determined by the two sampling systems from the time difference between a moment when the variation of the value of the waveform (a) converges within the range of ±LSB/2 and the rise time of the input data.

According to the present invention, the fast varying output of the test DA converter is sampled at a low frequency in synchronism with the conversion frequency of the AD converter. Therefore, the AD converter may be operated at a low conversion frequency and hence the reduction of the effective resolution of the AD converter can be avoided. Furthermore, the output waveform of the DA converter can be reproduced in a high density by selectively determining the relation between the sampling frequency of the sampling systems and the conversion frequency of the test DA converter, and thereby the fast varying phenomena representing the conversion characteristics of the test DA converter can be tested at a high accuracy.

Although the invention has been described in its preferred embodiments with a certain degree of particularity, it is to be understood that many variations and changes are possible in the invention without departing from the scope thereof.

What is claimed is:

1. A DA converter testing system comprising:
   a pattern generator which repeatedly generates digital codes to be applied to a test DA converter;
   first clock generating means which generates clock signals for regulating a period of pattern generation of the pattern generator;

AD conversion means which receives the analog output signals of the test DA converter;

second clock generating means which generates clock signals for regulating a conversion period of the AD conversion means so that the conversion period of the AD conversion means is greater than the waveform repeating period of the output repetitive waveform of the DA converter;

memory means for storing data of the AD conversion means; and computing means for analyzing the data stored in the memory means.

2. A DA converter testing system as recited in claim 1, wherein waveform sampling means for sampling the output waveform of the DA converter in synchronism with the conversion period of the AD conversion means is provided between the test DA converter and the AD conversion means.

3. A DA converter testing system as recited in claim 1, wherein a low-pass filter is provided between the test DA converter and the AD conversion means.

4. A DA converter testing system as recited in claim 1, wherein said first clock generating means comprises a first frequency synthesizer which receives signals from a reference frequency oscillator means, and a first clock pulse generator which receives signals from the first frequency synthesizer, while said second clock generating means comprises a second frequency synthetsizer which receives signals from said reference frequency oscillator means, and a second clock pulse generator which receives signals from the second frequency synthesizer.

5. A DA converter testing system as recited in claim 3, wherein said first clock generating means comprises a frequency synthesizer which receives signals from a reference frequency oscillator means, and a clock pulse generator which receives signals from the frequency synthesizer, while said second clock generating means comprises a divider which receives signals from the clock pulse generator.

6. A DA converter testing system as recited in claim 5 further comprising a variable delay circuit which receives signals from the divider.

7. A DA converter testing system comprising:
a pattern generator which repeatedly generates digital codes to be applied to a test DA converter;
first clock generating means which generates clock signals for regulating a repetition period of the output digital codes of the pattern generator;
waveform sampling means which receives the analog output signals of the test DA converter;
AD converter means which receives the output signals of the waveform sampling means;
sampling clock generating means which applies a clock signal of a period greater than the waveform repeating period of the analog output signals of the DA converter to the waveform sampling means and the AD conversion means;
memory means for storing output data of the AD conversion means; and
computing means which analyzes the output data of the AD conversion means stored in the memory means.

8. A DA converter testing system as recited in claim 7, wherein said clock generating means comprises a first frequency synthesizer which receives signals from a reference frequency oscillator means, and a clock pulse generator which receives signals from the first frequency synthesizer, while said sampling clock generating means comprises a second frequency synthesizer which receives signals from the reference frequency oscillator means, and a sampling clock generator which receives signals from the second frequency synthesizer.

9. A DA converter testing system as recited in claim 7, wherein said waveform sampling means comprises a sampling head, an amplifier which receives the output signals of the sampling head, and a sample-hold circuit which receives the output signals of the amplifier.

10. A DA converter testing system as recited in claim 7, wherein a frequency $f_{in}$ of a repetition frequency of the output digital codes of the pattern generator, a sampling frequency $f_{SPL}$ generated by the sampling clock generating means, a natural number n, a frequency $\Delta f$ smaller than the sampling frequency $f_{SPL}$ meet an equation: $\Delta f_{in} = n\, f_{SPL} + \Delta f$.

11. A DA converter testing system comprising:
a pattern generator which repeatedly generates digital codes to be applied to a test DA converter;
clock generating means which generates clock signals for regulating a repetition period of the output digital codes of the pattern generator;
first waveform sampling means which receives an analog output signal of the test DA converter;
first AD conversion means which receives the output of the first waveform sampling means;
second waveform sampling means which receives the output of the pattern generator;
second AD conversion means which receives the output of the second waveform sampling means;
sampling clock generating means which applies clocks of a period greater than the period of waveform repetition of the analog output signal of the test DA converter to the first waveform sampling means, the first AD conversion means, the second waveform sampling means and the second conversion means;
memory means which stores the respective output data of the first AD conversion means and the second AD conversion means; and
computing means which analyzes the data stored in the memory means.

12. A DA converter testing system as recited in claim 11, wherein said clock generating means comprises a first frequency synthesizer which receives signals from a reference frequency oscillator means, and a clock pulse generator which receives the output signals of the first frequency synthesizer; said sampling clock generating means comprises a second frequency synthesizer which receives signals from the reference frequency oscillator means, and a sampling clock pulse generator which receives the output signals of the second frequency synthesizer.

13. A DA converter testing system as recited in claim 11, wherein said first waveform sampling means comprises a sampling head, an amplifier which receives the output of the sampling head, and a sample-hold circuit which receives the output of the amplifier.

14. A DA converter testing system as recited in claim 11, wherein said second waveform sampling means comprises a sampling head, an amplifier which receives the output of the sampling head, and a sample-hold circuit which receives the output of the amplifier.

15. A DA converter testing system as recited in claim 11, wherein a frequency $f_{in}$ of a repetition of the output digital codes of the pattern generator, a sampling frequency $f_{SPL}$ generated by the sampling clock generating means, a natural number n, and a frequency $\Delta f$ smaller than the sampling frequency $f_{SPL}$ meet an equation: $\Delta f_{in} = n\ f_{SPL} + \Delta f$.

16. A DA converter testing system as recited in claim 11, wherein a delay line is provided between said sampling clock generating means and said second waveform sampling means.

* * * * *